United States Patent [19]

Yuan et al.

[11] Patent Number: 5,053,346
[45] Date of Patent: Oct. 1, 1991

[54] METHOD FOR MAKING A HIGH SPEED GALLIUM ARSENIDE TRANSISTOR

[75] Inventors: Han-Tzong Yuan; Liem Th Tran, both of Dallas, Tex.

[73] Assignee: Texas Instruments Incorporated, Dallas, Tex.

[21] Appl. No.: 495,951

[22] Filed: Mar. 20, 1990

Related U.S. Application Data

[60] Division of Ser. No. 462,926, Jan. 12, 1990, Pat. No. 4,956,689, which is a continuation of Ser. No. 338,445, Apr. 12, 1989, abandoned, which is a continuation of Ser. No. 65,433, Jun. 23, 1987, abandoned.

[51] Int. Cl.$^5$ .......................................... H01L 21/265
[52] U.S. Cl. ................. 437/22; 148/DIG. 11; 437/31
[58] Field of Search ............... 148/DIG. 10, 11, 50, 148/56, 65, 72, 83, 84, 76, 96, 110, 119, 169, 33, 33.1, 33.3, 33.4; 156/610–614; 357/16, 20, 31, 55, 56; 437/22, 38, 31, 32, 81, 105, 107, 126, 133, 936, 956, 981, 947, 987

[56] References Cited

U.S. PATENT DOCUMENTS

| | | | |
|---|---|---|---|
| 4,483,726 | 11/1984 | Isaac et al. | 437/31 |
| 4,745,085 | 5/1988 | Shieh | 437/31 |
| 4,749,661 | 6/1988 | Bower | 437/33 |
| 4,751,195 | 6/1988 | Kawai | 437/31 |
| 4,789,643 | 12/1988 | Kajikawa | 437/31 |
| 4,916,083 | 4/1990 | Monkowski et al. | 437/31 |

FOREIGN PATENT DOCUMENTS

| | | | |
|---|---|---|---|
| 0206787 | 12/1986 | European Pat. Off. | 357/16 |
| 0221151 | 9/1987 | Japan | 437/31 |
| 0060565 | 3/1988 | Japan | 437/33 |
| 0200567 | 8/1988 | Japan | 437/31 |
| 0201956 | 8/1989 | Japan | 437/33 |

OTHER PUBLICATIONS

Sakai et al., Electron Lett., vol. 19, No. 8, Apr. 14, 1983, pp. 283–284.
McLevige et al., IEEE Electron Device Lett., vol. 3, No. 2, Feb. 1982, pp. 43–45.
Yuan et al., IEEE, International Solid-State Circuits Conference, Feb. 19, 1986, pp. 74–75.

*Primary Examiner*—Olik Chaudhuri
*Assistant Examiner*—William D. Bunch
*Attorney, Agent, or Firm*—Melvin Sharp; James T. Comfort; N. Rhys Merrett

[57] ABSTRACT

Vertical buried emitter heterojunction bipolar transistors having greatly reduced emitter to base junction area and collector dimensions are fabricated in a gallium arsenide substrate to form an integrated circuit structure. The ability to scale these critical dimensions is made possible by forming a portion of the base along the side walls and bottom of a trench which has been etched in the upper two layers of a layered gallium arsenide structure. The base is formed by implanting beryllium into the surface of an upper layer, the trench sidewalls which are formed in an undoped layer, and the bottom of the trench which is an undoped layer formed on the buried emitter. A GaAs collector layer having reduced lateral dimensions is deposited in the trench and in part, on the surface of the layered structure. Since only a small portion of the base region (the bottom of the trench) is in direct contact with the heavily doped emitter layer, the emitter to base junction area can be significantly reduced. This in turn reduces the capacitance associated with this junction and correspondingly improves device operating speed. By forming a portion of the collector in the trench, the lateral dimensions of the transistor may be reduced and higher levels of device integration are made possible.

12 Claims, 2 Drawing Sheets

METHOD FOR MAKING A HIGH SPEED GALLIUM ARSENIDE TRANSISTOR

This is a division of application Ser. No. 462,926, filed Jan. 12, 1990, now U.S. Pat. No. 4,956,689, which is a continuation of Ser. No. 338,445, filed Apr. 12, 1989, abandoned, which is a continuation of Ser. No. 065,433, filed June 23, 1987, abandoned.

BACKGROUND OF THE INVENTION

The present invention relates to electronic semiconductor devices and methods of fabrication, and more specifically, to scaled, high speed gallium arsenide bipolar transistors with reduced emitter base junction capacitance.

Semiconductor devices fabricated in gallium arsenide are preferred over devices processed in silicon for high frequency applications due to the higher mobility of carriers in gallium arsenide. Furthermore, most gallium arsenide technologies are expected to exhibit improved radiation hardness for total dose ionizing radiation. Recent advances in epitaxial technology have made possible a gallium arsenide bipolar transistor with a wide band gap emitter. Such heterostructure devices, which employ energy gap variations rather than electric fields to control the forces acting on carriers, allow optimized doping levels and device scaling which result in even higher speed devices. Further improvement in operating speed can be realized by scaling down the lateral dimensions of the transistor. Such scaling, however, is limited by the difficulty in contacting the transistor in a simple planar layout. While some attempt has been made to realize a scaled heterojunction bipolar device by using sophisticated photolithographic techniques, it appears that the greatest promise lies in the formation of a layered structure that is suitable for device scaling. Such techniques have been successfully utilized in fabricating a scaled down silicon transistor. For background, see T. Sakai, et al., Gigabit Logic Bipolar Technology: Advanced Super Self-Aligned Process Technology, Electron. Lett., Vol. 19, No. 8, pp. 283–284, Apr. 14, 1983.

The recognized advantages of GaAs buried-emitter heterojunction devices in integrated circuit form were reported by W. V. McLevige et al in GaAs/AlGaAs Heterojunction Bipolar Transistors for Integrated Circuit Applications, IEEE Electron Device Letters, Vol. EDL-3, No. 2, Feb. 1982. More recently, the improved characteristics of this technology have been realized in the fabrication of a 4K gate array which employed heterojunction inverted transistor integrated logic (HI2L) (Yuan et al., A 4K GaAs Gate Array, 1986 ISSCC Dig. Tech. Papers 74). While these developments are impressive, the need for even higher operating speeds and greater device packing density is ever present. Clearly, improved device characteristics and packing density may be realized by scaling device geometries; however, present HI2L transistor structures, such as those reported in the above references, embody several built-in limitations that make reduction of feature size difficult. For instance, the current devices incorporate a P+ base contact region that requires excessive area to ensure ohmic contact to the base. This large area P+ region accounts for as much as one half of the emitter to base junction capacitance which reduces operating speed. In addition, present HI2L designs employ a collector region that is difficult to down-size because it must be large enough to permit a nested Schottky contact. While self-aligned processes offer some improvement, it is not expected that this technique will reduce emitter to base area by more than a factor of two to three.

Accordingly, it would be desirable to form a bipolar transistor having reduced emitter to base junction area which is capable of being scaled down without the limitation of excessive collector and base areas required for base and nested Schottky contacts.

SUMMARY OF THE INVENTION

In accordance with the present invention, there is provided an improved buried emitter bipolar transistor structure that is formed with minimal emitter to base junction area and a collector region with reduced lateral dimensions. The novel method which results in the reduction of these critical geometries, permits improvement in speed over that possible using known heterojunction GaAs technology. In addition, the ability to scale the upper level collector while retaining the area required for Schottky contact formation allows for much improved levels of integration. More specifically, the above is accomplished by providing a layered structure with layers of N+ type aluminum gallium arsenide, undoped GaAs, undoped AlGaAs and a final layer of P+ doped GaAs which are all formed on an N+ doped GaAs substrate. A collector region is formed by selectively etching a trench through the upper two layers. Beryllium is implanted to form a base region along the walls and bottom of the groove and an N+ GaAs collector layer is selectively grown in the groove so as to cover the bottom and side walls wherein the base region was previously implanted. Contacts to the collector and base regions may then be formed using standard contact metallization materials. For instance an ohmic contact to the collector may be formed by the selective deposition of a gold germanium alloy and base contacts may be formed by the a similar deposition of a gold zinc alloy. If Schottky barrier fan-out isolation diodes are desired, layers of titanium, platinum and gold may be selectively deposited on the collector region. The above process steps are in some respects similar to those disclosed by W. V. McLevige et al. in U.S. patent application Ser. No. 317,367, filed Nov. 2, 1981, which is now U.S. Pat. No. 4,573,064 and is hereby incorporated by reference. The above referenced patent discloses a basic buried emitter GaAs bipolar transistor process which does not provide for the novel ability to scale critical geometries as does the present invention.

DETAILED DESCRIPTION OF THE PREFERRED EMBODIMENT

Figure 1:
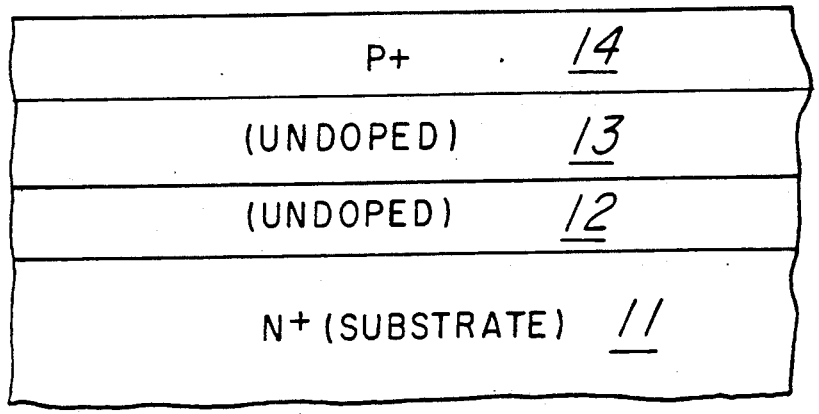
FIG. 1 is a cross-sectional view of the substrate material with epitaxial layers in place over the substrate.

As shown in FIG. 1, one embodiment of the present invention begins with a structure having a substrate 11 formed from aluminum gallium arsenide ($Al_xGa_{1-x}As$) material approximately 1 micron thick. This substrate material will form the emitter of the inverted, heterojunction bipolar device. The percentage of aluminum in the alloy is preferably defined by x having a range of from 0.05 to 0.1. By doping the gallium arsenide with aluminum, a heterojunction having increased bandgap difference and greater emitter efficiency may be formed. This in turn results in increased transistor gain and a corresponding improvement in device operating speed. For example, a 10% substitution of aluminum in the gallium arsenide (x=0.1) will result in an approximate 100meV increase in bandgap. A layer of undoped gallium arsenide 12 having a thickness of approximately 0.2 microns is next grown on substrate 11. The donor concentration in this layer may be approximately $10^{15}/cm^3$ as a result of the presence of remnant impurities. Next, a layer of undoped aluminum gallium arsenide 13 is grown on layer 12. The thickness of this layer may be approximately 0.3 microns and the aluminum concentration may be the same as that of layer 11. Layer 13 is doped with aluminum to allow the selective etching of this layer in a later operation to be described herein below. Finally, the structure of FIG. 1 is completed by growing a layer of P doped gallium arsenide 14 on layer 13. This final layer may have a thickness of approximately 0.2 microns and may be doped with, for instance beryllium to a concentration level of approximately $10^{19}/cm^3$.

Figure 2:
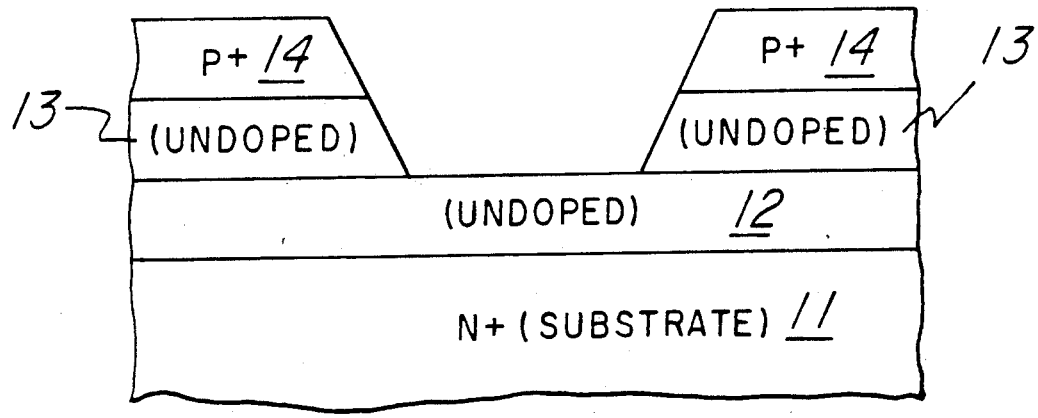
FIG. 2 is a cross-sectional view of the structure after the collector region has been defined by selectively etching a trench through the top two layers.

Referring next to FIG. 2, a trench is selectively formed in a region where a transistor is desired by etching through the layers 14 and 13 only at the desired location. It is necessary that this etching operation terminate on undoped GaAs layer 12 since the portion of this layer that is adjacent the bottom of the trench will become the active base region in a later operation. Accordingly, it can be appreciated that the etching step will require an orientational and AlGaAs selective etch. For instance, etchants such as sulfuric acid ($H_2SO_4$) and hydrofluoric acid (HF) should provide the appropriate etching of heavily P-doped layer 14 and undoped AlGaAs layer 13, respectively, but terminate at the surface of undoped GaAs layer 12.

Figure 3:
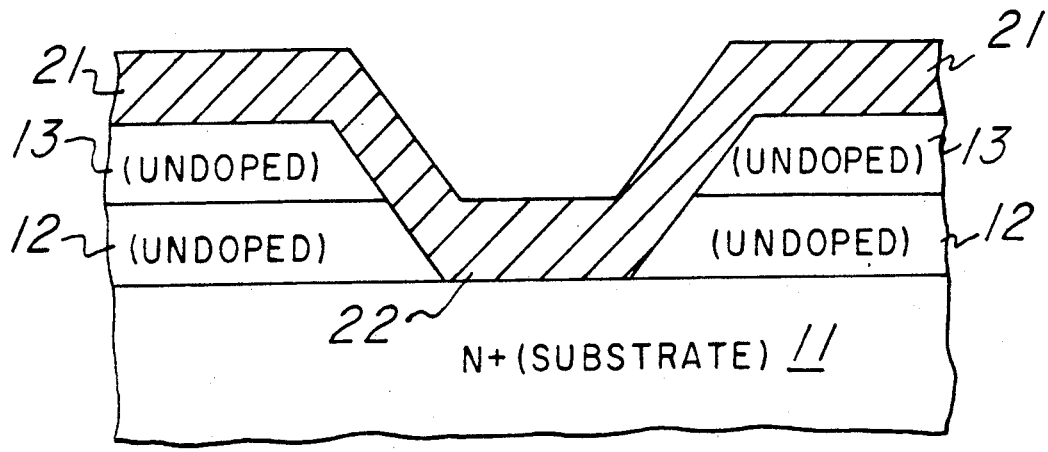
FIG. 3 is a cross-sectional view after ion implanting the base region.

Once the trench is formed, the structure is prepared for the ion implantation of the transistor base region. Referring to FIG. 3, the structure is subjected to a blanket ion implantation operation which forms heavily doped base layer 21 by doping the remaining portions of layer 14, the trench sidewalls in layer 13, and the region 22 of undoped layer 12 that is exposed to the dopants by the open trench. The ion implant step may be accomplished by implanting the structure with, for example, $8 \times 10^{12}$ cm$^{-2}$ of beryllium at 80 kEv. In alternate embodiments, the implant dopant source may include Mg, Cd, or Zn.

In situ annealing may be performed to eliminate the surface damage present after the ion implant operation and to ensure a sharp doping profile. This technique involves annealing the structure inside an OM-CVD reactor and has been described by J. W. Tully in J. W. Tully, "Heterojunction Bipolar Transistors with Ion-Implanted Bases," IEEE Electron Device Letters, EDL-7, 203 (1986). The process as described in that work includes annealing at 920° C. for 10 min. in flowing $AsH_3/H_2$ atmosphere. ($AsH_3$ vapor pressure at $1.5 \times 10^{-2}$ torr. is sufficiently high that no difference in surface quality is noted before and after annealing.) Without removing the wafer from the reactor, the temperature is lowered to 750° C. and the collector GaAs growth is initiated as described hereinbelow. As mentioned above, it is the doped region 22 in layer 12 that defines the active base of the transistor. It can be recognized at this stage of the process that while base layer 21 provides ample surface area for contact formation over undoped layers 12 and 13, the junction area between highly doped active base region 22 and emitter (layer 11) may be dramatically reduced by minimizing the dimensions of the trench. The corresponding reduction in junction capacitance provides the desired improvement in operating speed.

Figure 4:
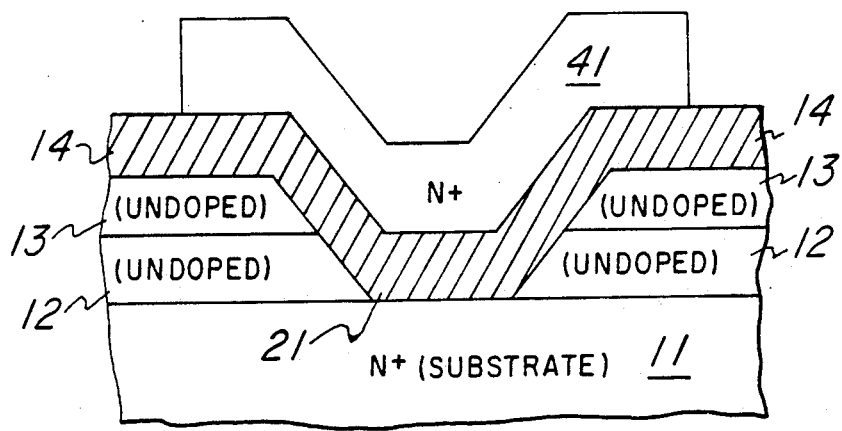
FIG. 4 is a cross-sectional view after the collector layer has been deposited and etched to form the upper layer of the basic transistor structure.

Referring next to FIG. 4, the process continues by forming a 0.3 micron layer of N+ doped gallium arsenide using standard epitaxial growth techniques. This layer of material will become the transistor collector region. Assuming that the in-situ annealing method described above is incorporated into the process, the preferred technique would be to grow layer 41 in the OM-CVD reactor used for the annealing process. Such methods are well known (see for example R. D. Dupius et al., "Preparation and properties of $Ga_{1-x}Al_xAs$—GaAs heterojunctions grown by metal organic chemical vapor deposition," Gallium Arsenide and Related Compounds 1978 (St. Louis), Inst. Phys. Conf. Ser., vol. 45, pp. 1-9, 1979). As shown, layer 41 is selectively deposited in the trenched regions where transistors are desired and preferably doped with a suitable N-type dopant such as silicon to a level of approximately $5 \times 10^{17}/cm^3$.

Figure 5:
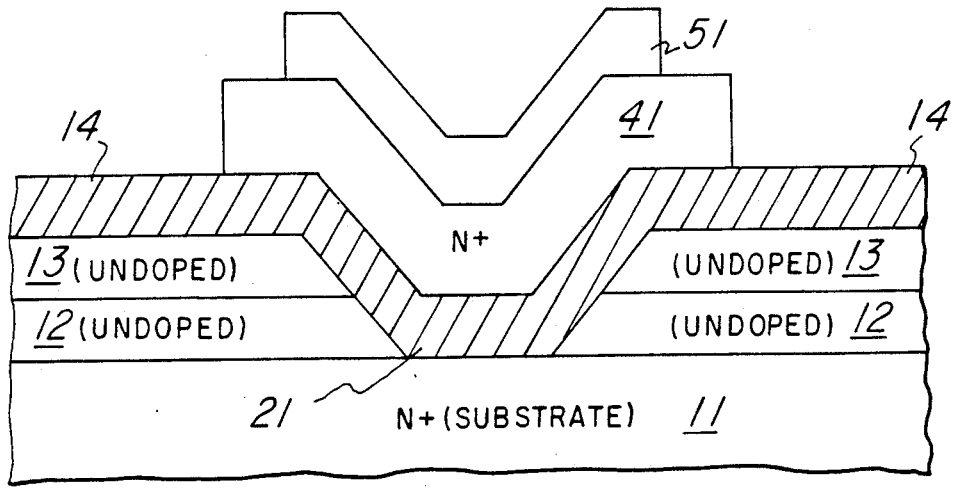
FIG. 5 is a cross-sectional view after contact material has been deposited to form the collector contact.

With reference next to FIG. 5, an ohmic contact 51 is made to the N+ collector region by depositing a gold-/germanium alloy (88% gold, 12% germanium) covered by nickel. The total thickness of these materials may be about 1,500 angstroms with the nickel having a thickness about 25% of that for the gold/germanium. Following the deposition as described, the structure is annealed at approximately 400 degrees C. for about 1 minute. Just prior to the above contact operation, it may be desirable to form ohmic contact to the emitter layer 11 by depositing the above gold/germanium alloy to the backside of the semiconductor wafer. This layer, which is not shown in the drawings, may be approximately 3,000 angstroms thick and is annealed after deposition using the anneal process described above.

Figure 6:
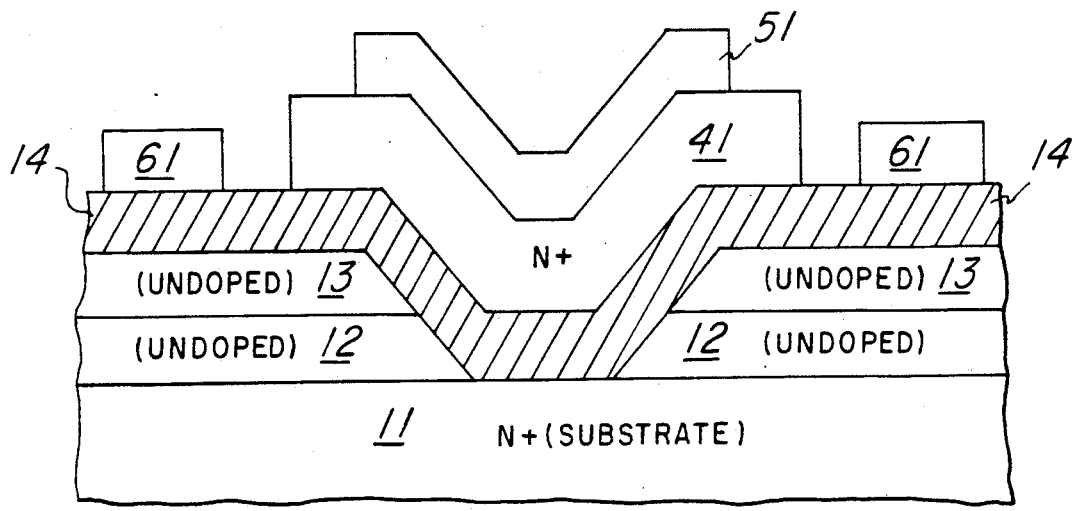
FIG. 6 is a cross-sectional view after contact material has been deposited to form the base contact.

As shown in FIG. 6, P+ bipolar base ohmic contacts 61 are formed by evaporating a gold zinc (AuZn) film on base layer 14 at selected locations over undoped layers 12 and 13 using well known techniques. The total thickness of this material should be approximately 3,000 angstroms. After AuZn deposition, the structure is annealed at 375 degrees C. for about 1 minute.

In an alternative embodiment, P+ contacts may be formed by an alloy of silver and manganese in a ratio of approximately 92% silver and 8% manganese. The total thickness of the combined material may be approximately 2,000 angstroms. Following the above deposition the structure would be annealed at approximately 375 degrees C. for about 1 minute.

The structure at this point in the process is ready for final interconnect metallization processing which may be accomplished using well known techniques. For instance, an insulating oxide layer (not shown) approximately 6,000 angstroms thick may be chemical vapor deposited and patterned to provide vias or openings to the ohmic contacts described above. If Schottky barrier fan out diodes are desired, a metallization system (not shown) including a 1,000 angstrom layer of titanium, a 500 angstrom layer of platinum and a 6,000 angstrom layer of gold may be deposited on the ohmic contacts. This aspect of the process is described in U.S. Pat. No. 4,573,064 which was herein above incorporated by reference. Numerous modifications of the preferred embodiment devices and methods may be made while retaining the desirable features of the self-aligned transistor structure having reduced emitter to base junction capacitance and a reduced area collector region. For example, as mentioned above, the base layer may be implanted with Mg, or Zn rather than Be. Furthermore, the emitter down bipolar transistor may be formed with a GaAs emitter instead of the preferred AlGaAs structure. While some loss in device performance is expected by this modification, the homojunction, GaAs emitter device may offer simpler processing since AlGaAs is more difficult to epitaxially grow.

The structure and method disclosed in the present invention represent an important advance to the continued development of large scale, high speed gallium arsenide technology. Transistor switching speeds that surpass even those of the fastest buried emitter heterojunction bipolar transistors presently available may be achievable. For example, an HI2L transistor produced in accordance with the invention may realize a 5 to 10 times reduction in emitter to base junction area compared to that of previous technology. Such a reduction in junction area may result in an HI2L gate that can switch as low as 30 ps (at a 1 micron emitter width). Furthermore, the inventive method permits device scaling that is free of the limitations found in previous buried emitter bipolar processes. For instance, by defining the active base region by the area of the bottom of a trench, this geometry may be downsized without concern for maintaining adequate area for P+ ohmic contacts. In addition, the collector area may be reduced and integration levels increased. The basic inventive structure may be used to implement either HI2L or HECL if a semiinsulating substrate is used for device isolation and all emitter down transistors are used for the overall circuit design. Therefore, it can be seen that the speed and device sizing improvements afforded by the invention make possible more highly integrated gallium arsenide memories and logic circuits that offer high speed and that are suitable for high radiation/high temperature environments.

While the invention has been described with respect to a specific preferred embodiment thereof, many variations and modifications will immediately become apparent to those skilled in the art. It is therefore the intention that the appended claims be interpreted as broadly as possible in view of the prior art.

We claim:

1. A method of forming a bipolar transistor in an integrated circuit comprising the steps of:
    (a) providing a substrate of semiconductor material doped to a first conductivity type to provide an emitter region;
    (b) forming a second layer of semiconductor material on said substrate;
    (c) forming a third layer of semiconductor material on said second layer;
    (d) forming a fourth layer of semiconductor material doped to a second conductivity type on said third layer to provide base contact regions;
    (e) etching a trench in said third and fourth layers at selected locations to expose portions of said second layer and thereby define the active region of said bipolar transistor;
    (f) doping said portions of said second layer and the sidewalls of said trench to form the active base region; and
    (g) forming a fifth layer of semiconductor material on at least said portions of said second layer to provide a collector region.

2. The method of claim 1, further comprising:
    forming a first electrical conductor on said collector region to form a collector contact; and
    forming a second electrical conductor on said base contact regions to form a base contact.

3. The method of claim 2, wherein said first electrical conductor includes a gold germanium alloy and said second electrical conductor includes a gold zinc layer.

4. The method of claim 1, wherein said substrate and said layers of semiconductor material are compound of elements selected from periodic table groups III and V.

5. The method of claim 4, wherein said compounds include gallium arsenide.

6. The method of claim 1, wherein said substrate and said third layer are aluminum gallium arsenide, said second and fourth layers are gallium arsenide, and an aluminum gallium arsenide selective etch is used to form said trench.

7. The method of claim 1, wherein said step of doping comprises ion implanting beryllium to form said base region.

8. A method of forming a bipolar transistor having an emitter, base and collector in a semiconductor integrated circuit, comprising the steps of:
    (a) providing a substrate of predetermined conductivity type;
    (b) forming a first layer of semiconductor material over said substrate;
    (c) forming a second layer of semiconductor material over said first layer;
    (d) etching away a portion of said second layer to form a trench and expose the first layer thereunder;
    (e) doping the exposed portion of said trench including the exposed portion of said first layer to a conductivity type opposite to that of said substrate;
    (f) forming a third layer of semiconductor material over at least a portion of said doped portions doped said first conductivity type; and
    (g) forming contacts to said doped portion and said third layer.

9. The method of claim 8, wherein said substrate and said layers are compounds of elements selected from periodic table groups III and V.

10. The method of claim 8, wherein said layers and substrate include gallium arsenide.

11. The method of claim 8, wherein said trench is formed by exposing at least said second layer of semiconductor material to a preferential etchant that etches said second layer at a higher rate than said first layer.

12. The method of claim 10, wherein said second layer is aluminum gallium arsenide.

* * * * *